United States Patent [19]

Whalin et al.

[11] 4,393,131
[45] Jul. 12, 1983

[54] METHOD FOR CAPTIVATING A SUBSTRATE WITHIN A HOLDER

[75] Inventors: Jeffery A. Whalin, Miami Lakes; Charles W. Shanley, Plantation; Michael N. Scansaroli, Pembroke Pines, all of Fla.; Lawrence N. Dworsky, Northbrook, Ill.

[73] Assignee: Motorola, Inc., Schaumburg, Ill.

[21] Appl. No.: 362,938

[22] Filed: Mar. 29, 1982

[51] Int. Cl.³ .............................................. G03C 5/00
[52] U.S. Cl. .................................... 430/320; 430/313; 430/314; 430/260; 156/630; 156/293; 29/25.35
[58] Field of Search ................. 430/22, 260, 312, 314, 430/315, 313, 320; 156/300, 301, 630, 293, 298; 29/25.35; 428/210, 433; 310/311

[56] References Cited

U.S. PATENT DOCUMENTS

| | | | |
|---|---|---|---|
| 1,199,943 | 10/1916 | Taylor | 353/30 |
| 1,632,278 | 6/1927 | Douglass | 430/370 |
| 1,739,886 | 12/1929 | Caps | 355/26 |
| 2,487,561 | 11/1949 | Landrock et al. | 355/26 |
| 2,942,568 | 6/1960 | Hamilton et al. | 249/84 |
| 3,040,619 | 6/1962 | Oxberry | 355/46 |
| 3,089,219 | 5/1963 | Williams | 29/582 |
| 3,171,187 | 3/1965 | Ikeda et al. | 29/574 |
| 3,250,048 | 5/1966 | Coulon | 249/84 |
| 3,507,592 | 4/1970 | McLaughlin | 355/77 |
| 3,531,198 | 9/1970 | Delp | 355/26 |
| 3,580,670 | 5/1971 | Bhagat | 355/3 R X |
| 3,622,241 | 11/1971 | Dexter | 355/110 |
| 3,624,724 | 11/1971 | Sheffer | 354/20 |
| 3,688,656 | 9/1972 | Applequist et al. | 354/7 |
| 3,959,527 | 5/1976 | Droege | 430/320 |
| 3,968,563 | 7/1976 | Hamlin | 29/591 |
| 4,026,008 | 5/1977 | Drees et al. | 29/574 |
| 4,230,757 | 10/1980 | Toner | 428/137 |
| 4,259,436 | 3/1981 | Tabuchi et al. | 430/314 |

OTHER PUBLICATIONS

R. A. Heinz, J. T. Chuss, C. M. Schroeder—Solid State Technology, Aug. 1978—Double Sided Photolithography, pp. 55-60.

Primary Examiner—John E. Kittle
Assistant Examiner—Jose G. Dees
Attorney, Agent, or Firm—Jerry A. Miller; Edward M. Roney; James W. Gillman

[57] ABSTRACT

A method of captivating a substrate within a holder for photolithographic processing is shown. A substrate is placed within the aperture of a holder and is sandwiched into place by laminating it with layers of dry film photopolymer resist. Portions of the photopolymer resist are polymerized. Unpolymerized portions are washed away leaving retaining tabs of polymerized resist which hold the substrate within the holder for an etching or plating process.

24 Claims, 8 Drawing Figures

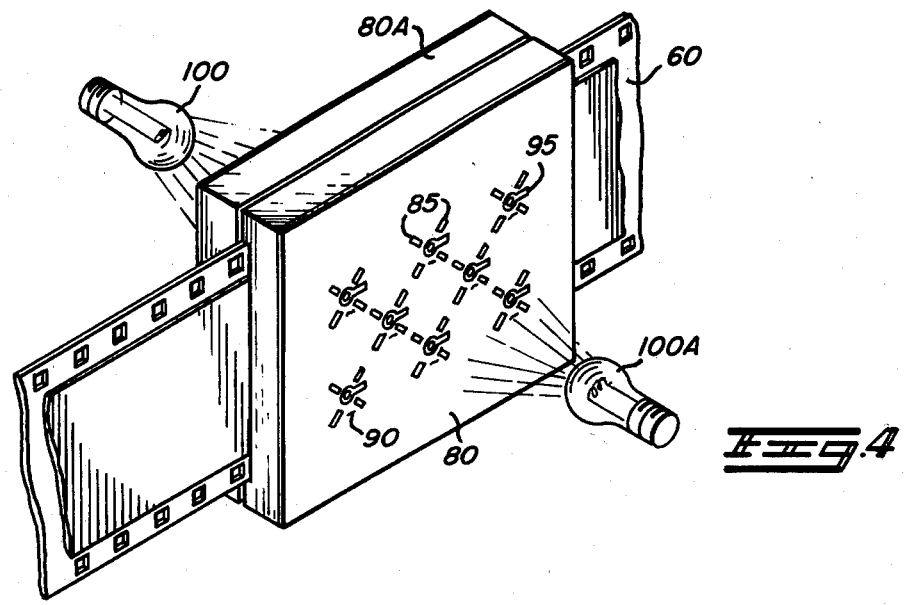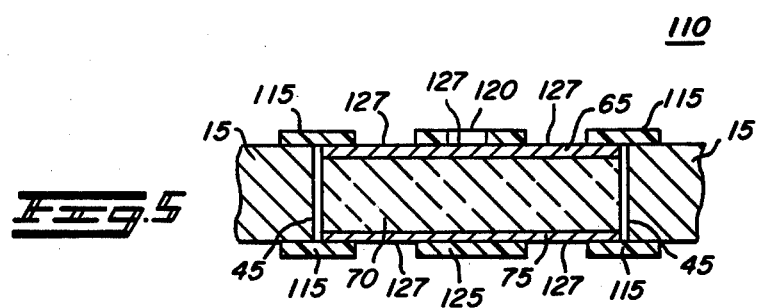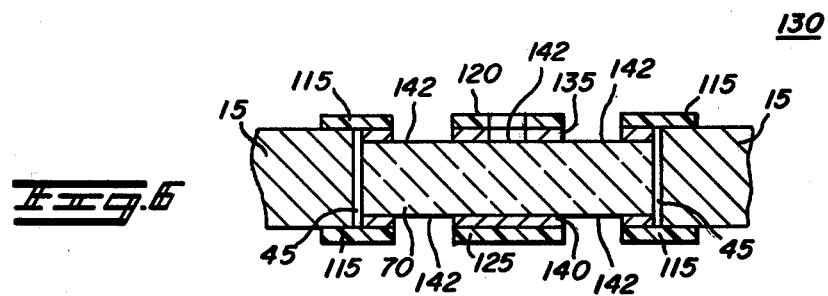

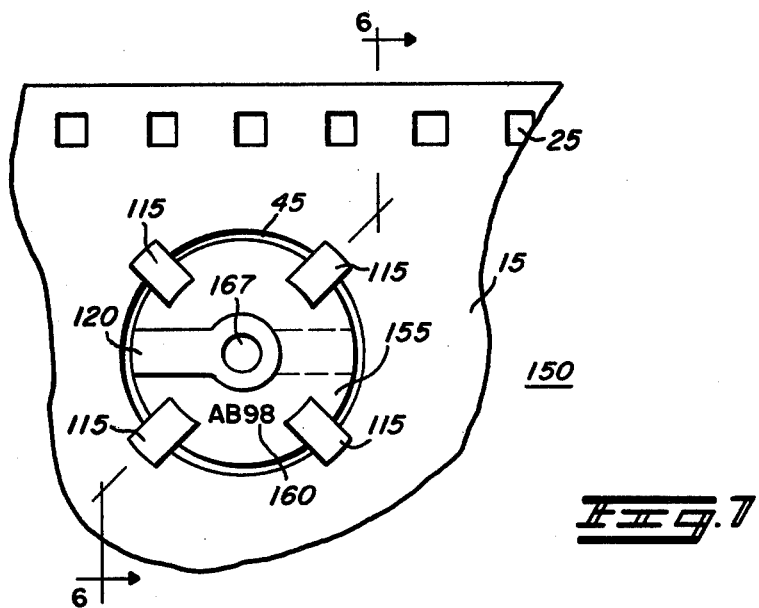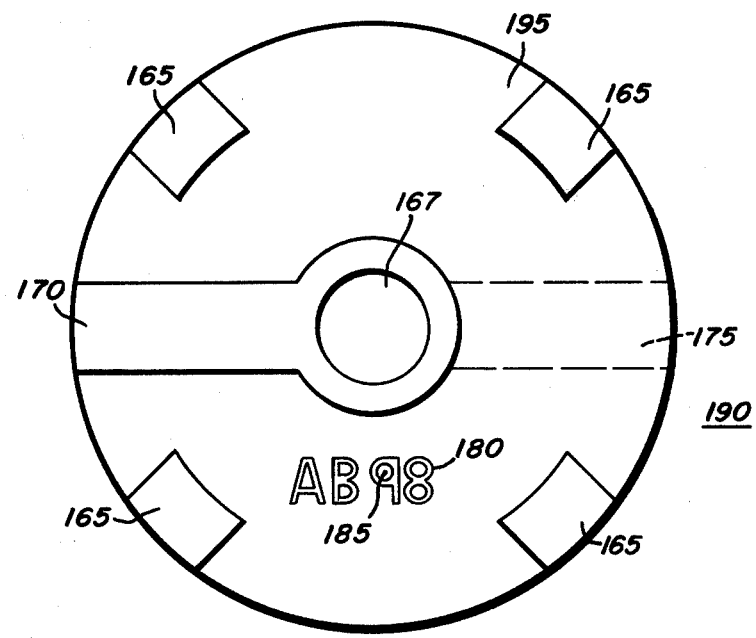

METHOD FOR CAPTIVATING A SUBSTRATE WITHIN A HOLDER

BACKGROUND OF THE INVENTION

1. Field of the Invention

This invention relates to the field of processes for creating metallization patterns on the surfaces of a substrate and more particularly to processes for creating high resolution metallization patterns on the surfaces of quartz crystals, hybrid circuits or semiconductor devices using photolithographic techniques which are readily adapted to automation.

2. Description of the Prior Art

The normally accepted manufacturing process for producing metallization areas on quartz crystal products is a stenciling process called shadow masking. In this process an apertured mask is placed in contact with a crystal blank which is sometimes polished. The apertures in the mask form a stencil pattern corresponding to places where metallization is desired and will be deposited. The masked blank is placed in a suitable vacuum cleaner. Metal is then evaporated within the chamber and adheres to the crystal's surface in the places exposed by the apertures of the stencil. In such a process resolution is moderate at best with dimensional accuracy being only within approximately 1/1000th inch. The resolution is limited by the accuracy with which a shadow mask can be manufactured by various machining or etching techniques.

If metal is to be deposited on both surfaces of the crystal by shadow masking, alignment of the desired patterns from front to back is difficult to control. This alignment typically varies from one crystal to the next, resulting in inconsistency in the crystal's motional parameters. The crystal's motional parameters determine the center frequency, passband shape, spurious response, and other electrical parameters. The masks are typically made of stainless steel or other metal with thickness of about 3/1000th of an inch. Intricate stencil patterns in this thin metal are easily bent or otherwise damaged.

In addition, due to the stenciling nature of the masks, not all patterns are producible by this method without using two or more iterations of the process. This generally results from the masks being punched or etched from a single sheet of metal. Many types of metallization patterns are impossible to fabricate. In addition, such masks are difficult and time consuming to make. This is a serious drawback to the experimental stages of crystal development.

In one method for making a tape carrier for manufacturing leads for integrated circuits, an adhesive backed flexible insulating tape is used to carry thin metal sheets of foil on its surface to produce integrated circuit leads. The insulating tape has one entire surface covered with adhesive and has holes punched in its surface which allow access to both sides of portions of the copper foil for processing by photolithographic techniques. Only that portion of the foil exposed by the aperture in the tape carrier is available for photolithographic processing on the surface contacting the adhesive. Bonding of the foil to the tape is accomplished by the adhesive properties of the tape.

Care must be taken to ensure that the finished assembly is not exposed to high temperatures which would cause the adhesive to lose strength. Care must also be exercised in the selection of developing and etching agents used in the processing of the leads also to ensure that they do not react adversely with the adhesive. The adhesive is prone to attracting dirt and dust wich can contaminate the chemicals used in further processing the tape carrier assembly.

Although other prior art devices are useful for forming flexible metal leads they are not well suited for processing more brittle workpieces such as ceramic or quartz crystal substrates. It is evident that separating such workpieces from the adhesive surface of a tape carrier would likely result in damage to a large number of the substrates. This would make production yield low and assembly costs unreasonably high. A further drawback of the tape carrier is that it is obviously usable only once as attempted reuse would degrade the adhesive properties of the tape carrier rendering the adhesive unreliable.

It is also known that both sides of a silicon wafer may be exposed simultaneously using double sided photolithography. Such exposures are normally made using an "alligator mask," which holds photolithographic masks in direct contact with photoresist coated silicon wafers. Other methods of double sided photolithography are known in the art.

SUMMARY OF THE INVENTION

It is an object of the present invention to provide an improved method of creating high resolution metallization patterns on one or both surfaces of a substrate.

It is another object of the present invention to improve front to back alignment and line resolution of metallization patterns on quartz crystals.

It is further object of the present invention to provide an improved method of captivating a substrate within a holder during processing.

It is a further object of the present invention to provide a method of captivating a quartz crystal in a holder during photolithographic processing for a single sided or a double sided process.

These and other objects of the invention will become apparent to those skilled in the art upon consideration of the following description of the invention.

The present invention is directed to providing a method of captivating a substrate having two opposed surfaces within a holder. The holder has two opposed major surfaces and at least one aperture which is appropriately dimensioned to accept the substrate. The substrate is placed within the aperture of the holder and a dry film photopolymer resist is laminated to at least one of the surfaces of the holder and the substrate. The photopolymer resist, therefore, captivates the substrate within the holder. The dry film photopolymer resist is then caused to polymerize in desired areas. One of these desired patterned areas should be an uninterrupted area extending from the surface of the holder to the surface of the substrate. The undesired areas of the dry film photopolymer resist are then removed. This leaves a retaining tab of resist in one corresponding uninterrupted desired area extending from the surface of the holder to the surface of the substrate. Several such tabs may be formed. The substrate is therefore captivated within the aperture of the holder by the dry film photopolymer resist before it is developed and by one or more retaining tabs after it is developed.

The features of the invention believed to be novel are set forth with particularly in the appended claims. The invention itself, however, both as to organization and

BRIEF DESCRIPTION OF THE DRAWINGS

FIG. 4 illustrates the exposure process for the dry film photopolymer resist.

FIG. 5 shows a portion of the cross-section of FIG. 3 after exposure and development of the photopolymer resist.

FIG. 6 shows the cross-section of FIG. 5 after metallization has been etched away.

FIG. 7 shows the crystal being retained in the holder by retaining tabs after exposure, development and etching.

FIG. 8 shows the completed quartz crystal.

DESCRIPTION OF THE PREFERRED EMBODIMENT

Figure 1:
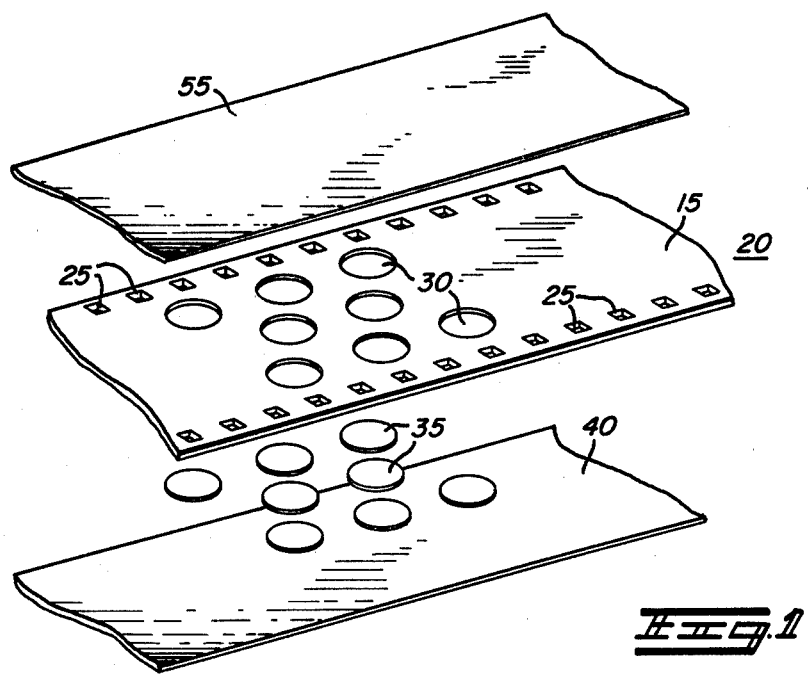
FIG. 1 shows an exploded view of the substrate holder showing the relative locations of the substrates and photoresist.

Referring to FIG. 1 of the preferred embodiment, the body 15 of a holder 20 is preferably composed of flexible stainless steel shim stock approximately 3/1000th of an inch thick. In the preferred embodiment the holder is stamped, etched or otherwise formed into a shape similar to 35 mm photographic film format. Drive holes 25 are located along each edge and are used to transport the holder through a processing system. The preferred embodiment adapts 35 mm photographic film drive equipment to this purpose.

Apertures 30 are of the same shape and of slightly larger dimensions than the substrate which the holder will accommodate. The aperture and substrate may or may not contain some keying mechanism to ensure the substrate is inserted with proper orientation if appropriate. In one embodiment, this process is used to produce high resolution metallization patterns on quartz crystals. Similar holders, however, could be manufactured for use with ceramic, metal, or silicon substrates. The pattern of holes 30 may be repeated at regular intervals throughout the length of the holder. Although a reoccurring specific pattern of eight (8) holes is shown for the preferred embodiment, any convenient number may be used.

Figure 2:
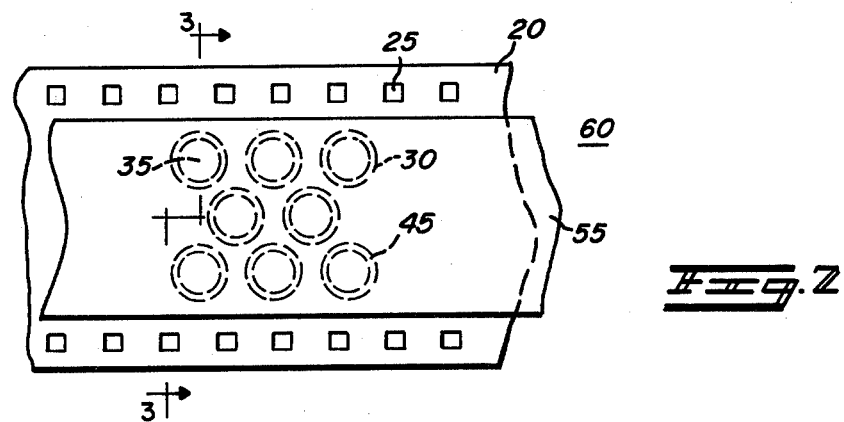
FIG. 2 shows the substrate holder of FIG. 1 after lamination.

In FIG. 1 and again in FIG. 2, one can see that the substrate 35, which is illustrated as a quartz crystal blank uniformally coated on one or both surfaces with a metal such as aluminum, is placed within the apertures of the holder. Space 45 between the aperture walls and the crystals is shown exaggerated for illustrative purposes. In the preferred embodiment about a 5 mil gap is present between the crystal and the holder. In one embodiment a very tight tolerance is held between the aperture of the holder and the crystal substrate in order to assure good alignment and registration. A dry film photopolymer resist 40 has been laminated to the bottom surface of the holder.

A dry film photopolymer resist (hereafter called "resist") is a substance which comes in a thin sheet and polymerizes when desired areas are exposed to certain wavelengths of light. In the preferred embodiment Riston ® made by Dupont, may be used, and it has been found that a 1.1 mil thick resist is optimum for this process. Dry film photopolymer resists have an advantage over liquid photopolymer resists in that the user does not have to be concerned with getting an even thickness with uniform coverage on the workpiece. After polymerization the unpolymerized areas of the dry resist can easily be washed away by immersing the resist in an appropriate developer as recommended by the manufacturer.

As illustrated by FIG. 2 the resist is cut into strips somewhat narrower than the width of the holder but wide enough to completely cover all apertures 30 of the holder while not interfering with drive holes 25. The resist is then laminated, using a heat lamination process, to the holder and the substrates are enclosed in the apertures of the holders. In the preferred embodiment resist 40 is actually laminated to the lower surface of holder 20 before the quartz crystals 35 are placed into the apertures 30. But the crystals could be placed in the holder before lamination takes place. The use of heat lamination eliminates the sticky tape used in other processes. Therefore, there is no adhesive to contaminate chemicals used later in the process and handling is much simpler.

In the next step of the process a second layer of resist 55 is laminated to the upper surface of the holder thus captivating the substrate on both sides with the dry resist. A frontal view of this assembly is shown as 60 in FIG. 2.

It should be noted that although the preferred embodiment shows boths sides of holder 30 laminated with resist, a single sided process is also possible since only one layer of resist is necessary to captivate the substrate.

Resist 55 is also of narrower width than the width of the holder 20 but greater width than is required to cover all apertures 30. Resist 55 is also heat laminated to the surface of the holder 20 and the surfaces of the substrate 35. The process may proceed in the following order: laminate the first side; place substrate in aperture; laminate the second side; the second laminating process for resist 55 (the upper side) should cause both the lower and upper layers of resist to adhere to the crystal substrate. The laminating process can be accomplished by passing the laminate between heated rollers.

Figure 3:
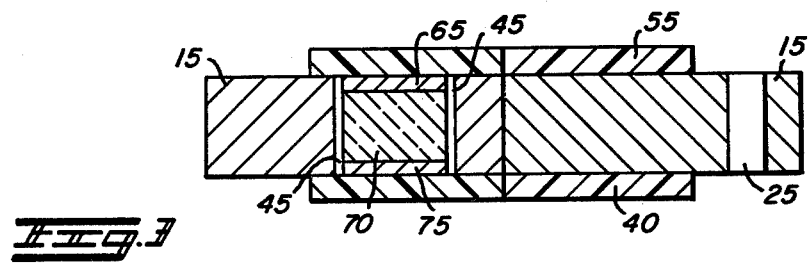
FIG. 3 shows a cross sectional view of FIG. 2 along line 3—3.

A cross-section of assembly 60 of FIG. 2 along lines 3—3 is shown in FIG. 3. This view more clearly illustrates the captivation of substrate 35 within apertures 30 of the holder 20 by resist layers 55 and 40. In this view, the quartz substrate 70 is shown to have metallization layers 65 and 75 on both surfaces. Although the substrate is shown to be the same thickness as the crystal, this is not required if a resiliant resist is used. This is because of a property of the resist known in the art as "tenting." As stated earlier, in the preferred embodiment the substrate is quartz and the metallization is aluminum. The spaces 45 between the holder body 15 and the substrate 70 may be greater than shown to allow the resist layers to collapse and touch one another. This makes a more secure bond to hold the substrate in place.

At this stage of the process the upper resist layer 55 is tightly bonded to the holder body 15 and the upper metallization 65. The lower resist layer 40 is tightly bonded to the holder body 15 and the lower metallization layer 75. Although this embodiment shows that the substrate is coated with metallization layers 65 and 75, it is not necessary for the adhesion of the resist. It is merely a function of this embodiment since a metal etching process is to follow. It will be evident to one skilled in the art that an unmetallized substrate could be masked with resist to allow selective plating, painting or sputtering of metal in unmasked areas.

FIG. 4 shows a photolithographic mask 80. This mask will be used in the next step of this process. The mask allows light to strike some portions of the resist layers while shading the light from other portions. In the preferred embodiment the clear areas will allow the light to strike the resist causing polymerization. It would be evident, however, to anyone skilled in the art that although this embodiment is a positive process the process could also be implimented as a negative process using the negative of this mask and a different type of resist and/or developer. One of the many advantages of using a lithographic mask such as mask 80 is that any type of pattern which can be drawn and/or photographed can be realized on the surface of the substrate within the resolution accuracy of the film and resist.

In one embodiment, crystal electrode patterns 95 are formed on a quartz substrate by this process. Arbitrary code numbers and letters 90 may also be formed by this process. As will be explained later, these numbers and letters, as shown, could not be manufactured on the finished product with a single shadow masking process. Such photolithographic masks can be made of any number of materials. In the preferred embodiment glass masks are used. In the photolithographic process, photolithographic mask 80 is the counterpart of the shadow mask in a shadow masking process. Since it is manufactured photographically its resolution is approximately a factor of ten better than that of a mechanically bored or chemically etched shadow mask. This results in a direct improvement in the crystal's electrical parameters.

As stated earlier, shadow masks are typically made of shim stock of about 3/1000th of an inch. Due to their very nature, long free-standing pattern members are not possible in a production environment since normal wear and tear will damage or wear out these masks in a very short period of time. Such long members made of such thin material can hardly support their own weight and are very easily damaged. Since the patterns on photolithographic masks are photographic, they exhibit no such problem.

In the present invention one or more clear tab areas 85 located at the perimeter of each substrate is placed on the glass mask. These tab areas 85 form retaining tabs in the resist material. These retaining tabs will be attached both to the substrate and to the holder as will be shown in later steps.

FIG. 4 further illustrates the process of exposing the photoresist in a double sided version of the present process. Although FIG. 4 shows two light sources 100 and 100a, many techniques are known and may be used for exposing both sides using only one source. Any of those techniques could easily serve the same purpose.

In the exposure step, holder assembly 60 is sandwiched between and placed in contact with photomasks 80 and 80A. Since these are optical masks they may be readily aligned by any number of methods before assembly 60 is placed therebetween. The captivated substrate within assembly 60 is then carefully aligned with the pre-aligned masks 80 and 80A. The total assembly is then held rigidly in place while exposure by light sources 100 and 100A takes place. In the preferred embodiment the light sources 100 and 100A are short wave ultra-violet light sources. This however, is a function of the characteristics of the dry film photopolymer resist.

After exposure is complete, assembly 60 is removed from between the glass masks. It should be noted that one distinct advantage of this process is that masks 80 and 80A are easily duplicated photographically. Thus, if a mask is scratched or should it break, it is easily replaced at low cost. This is in sharp contrast with shadow masks. Also, new masks for experimental designs are quickly and readily fabricated directly from artwork done in drafting tape.

FIG. 5 shows a portion of the same cross-section as that shown in FIG. 3 after exposure has taken place and the undesired unpolymerized areas of the resist have been removed. Removal of the undesired resist areas is accomplished by exposing the entire assembly 60 to an appropriate developing agent as specified by the manufacturer of the resist. It should be noted that holding tabs 115 securely hold the substrate in place and further serve to absorb shocks and stresses if assembly 110 is flexed. They thus provide support and protection to the fragile crystal substrate while allowing flexing or rolling of the holder. This allows a holder of great length to be rolled onto a reel similar to motion picture film without damaging the substrate.

In areas 127 the resist has been dissolved to expose metallization 65 and 75. Resist areas 120 and 125 now mask areas of metallization 65 and 75 respectively which will become upper and lower crystal electrodes respectively. These areas will be protected by the resist during the process steps that follow. In the preferred embodiment, it is desired to etch away metallization which was previously deposited to surfaces of substrate 70. The chemicals used to perform the etching process should not affect the holder material if the holder is to be reused. It will be evident to those skilled in the art that a plating process or other types of processes can be implemented using this photolithographic masking technique.

FIG. 6 shows the same assembly 130 after an etching process has taken place. The metallization which formerly covered areas 142 has been etched away by an appropriate solution, and the bare crystal is exposed. FIG. 7 shows a frontal view of assembly 130. Cross-section 130 could be taken along line 6—6 of FIG. 7. Here one clearly sees retaining tabs 115 suspending crystal 155 in place within the holder 20. The tabs 115 are uninterrupted in an area from the surface of the substrate to the surface of the holder. Also shown is the resist covered electrode 120 and resist covered code letters and numbers 160. The resist on these remaining resist covered areas can now easily be washed away with an appropriate solvent, thereby releasing the substrate from the holder. In the preferred embodiment the solvent is acetone. Alternatively, removal from the holder can be accomplished by a punching operation, a cutting operation or even cutting away the retaining tabs with a laser. Such a step would normally be followed by dissolving away the remaining resist left on the substrate.

FIG. 8 shows the finished crystal product 190. Metallization areas 165 remain where the retaining tabs 115 once were. This tab metallization should be either stratigically placed so as not to interefere with the operation of the crystal (or other device), or removed by some means. Alternatively, the metallization areas 165 can be used as a portion of the substrate electrodes or metal patterns themselves. In this manner they will serve a multiple function and removal is not necessary or desired.

Front electrode 170 and backside electrode 175 now constitute exposed metallization areas where before they were covered with photoresist. For illustrative purposes code letters and numbers 180 have been shown on the finished product. Note that the freestanding areas such as 185 of alpha or numeric characters or 167 of the electrode pattern could not have been produced by shadow mask stenciling. This is due to the stenciling nature of the shadow mask process. Similarly, freestanding electrode patterns can be more readily generated using photolithography. Such patterns could only have been generated previously by shadow masking with multiple shadow masks, or other complicated processes which greatly increase process cost and risk of damage to the substrate and masks during handling. Such freestanding areas as 167 are known in the art to improve spurious responses, but were difficult to manufacture until now.

One can therefore see the above method indeed captivates the substrate during processing. The holder can be reused many times, and there is no messy adhesive to contaminate the process. In addition, it has been found that pattern resolution with the photolithographic process is approximately 10 times better than with shadow masks. Dimensions can be held to within 1/10,000th inch with photolithography compared to 1/1000th inch with shadow masks. Also photolithography lends itself to many known methods of attaining good front to back allignment. All these factors contribute to direct improvement in a crystal's electrical performance.

Thus it is apparent that there has been provided in accordance with the invention a method that fully satisfies the objects, aims, and advantages set forth above. While the invention has been described in conjunction with specific embodiments thereof, it is evident that many alternatives, modifications and variations would be apparent to those skilled in the art in light of the foregoing description. Accordingly, it is intended to embrace all such alternatives, modifications and variations as fall within the spirit and broad scope of the appended claims.

We claim:

1. A method of captivating a substrate within a holder for photolithographic processing comprising the steps of:
   placing a substrate having two opposed major surfaces within a holder, said holder having two opposed major surfaces and at least one aperture appropriately dimensioned for accepting said substrate;
   laminating a dry film photopolymer resist to at least one surface of said holder and said substrate, thereby captivating said substrate within the aperture of said holder;
   polymerizing said resist in desired areas including at least one uninterrupted area extending from one surface of said holder to a corresponding surface of said substrate;
   removing resist in the undesired areas, thereby leaving a retaining tab of resist in at least one uninterrupted area extending from one surface of said holder to one surface of said substrate.

2. A method in accordance with claim 1 wherein said polymerizing step is accomplished by exposing said dry film photopolymer resist to light of an appropriate wavelength for an appropriate length of time.

3. A method in accordance with claim 2 wherein the laminating step is accomplished by a heat laminating process.

4. A method in accordance with claim 3 further including the step of removing said substrate from said holder after resist is removed from undesired areas.

5. A method in accordance with claim 4 wherein the step of removing said substrate from said holder is accomplished by a process which cuts said retaining tabs.

6. A method in accordance with claim 4 wherein the step of removing said substrate from said holder is accomplished by a punching process.

7. A method in accordance with claim 4 further including the step of dissolving all resist from the surfaces of said substrate with an appropriate solvent as the last step.

8. A method in accordance with claim 7 further including the step of selecting an acetone solution for said solvent prior to said dissolving step.

9. A method in accordance with claim 7 wherein said dry film photopolymer resist is exposed by passing light through photolithographic masks during the exposing step.

10. A method in accordance with claim 9 wherein said photolithographic masks are in contact with said dry film photopolymer resist during the exposing step.

11. A method in accordance with claim 10 further including the step of, providing said holder with drive holes spaced at regular intervals along the length and near an edge of said holder, prior to the placing step.

12. A method in accordance with claim 11 wherein said drive holes are compatible with 35 mm photographic film drive equipment.

13. A method in accordance with claim 11 further including the step of choosing stainless steel for the material from which said holder is made prior to the step of providing said holder.

14. A method in accordance with claim 11 including the step of plating metal on a surface of said substrate after resist is removed from undesired areas.

15. A method in accordance with claim 11 further including the step of metal plating said substrate on at least one surface prior to the step of placing said substrate.

16. A method in accordance with claim 15 further including the step of etching said metal plating after resist is removed from undesired areas.

17. A method in accordance with claim 15 further including the step of selecting aluminum for said metal prior to the plating step.

18. A method in accordance with claim 14 or 16 further including the step of selecting quartz for the substrate material as a first step in the process.

19. A substrate processed in accordance with the method of claim 1.

20. A method of captivating a quartz crystal device within a holder for photolithographic processing comprising the steps of:
   placing a quartz crystal having two opposed major surfaces, at least one of said surfaces being uniformly plated with aluminum, within a holder having two opposed major surfaces, said holder having at least one aperture appropriately dimensioned for accepting said crystal;
   laminating a dry film photopolymer resist to at least one surface of said holder and at least one aluminum plated surface of said quartz crystal, thereby captivating said quartz crystal within the aperture of said holder;

exposing said resist to light passed through a photolithographic mask causing polymerization in desired areas including at least one uninterrupted area extending from the surface of said holder to the surface of said quartz crystal;

removing unpolymerized resist, thereby leaving retaining tabs in at least one uninterrupted area extending from the surface of said holder to the surface of said quartz crystal, etching away said aluminum from areas exposed by removing unpolymerized resist.

21. A quartz crystal device processed in accordance with claim 20.

22. A method of captivating a quartz crystal within a holder for photolithographic processing comprising the steps of:

providing a quartz crystal having two opposed major surfaces, said surfaces being uniformly aluminum plated;

providing a stainless steel holder having two opposed major surfaces and drive holes spaced at regular intervals along the length of said holder near its edges rendering said holder compatible with 35 MM photographic film drive equipment, said holder having a plurality of apertures appropriately dimensioned for accepting said crystal;

placing said quartz crystal within the aperture of said holder forming a first assembly having two opposed major surfaces;

heat laminating a dry film photopolymer resist to both surfaces of said first assembly by passing said first assembly with resist on each surface between heated rollers to form a second assembly, sandwiching said second assembly between and substantially in contact with two photolithograph glass masks, polymerizing desired areas of said resist on both surfaces simultaneously by passing ultra-violet light through said masks including at least one uninterrupted area extending from the surface of said holder to the surface of said crystal, passing said second assembly through a developing agent suitable for removing unpolymerized resist, passing said second assembly through a solution suitable for etching aluminum, removing said crystal from said holder, dissolving polymerized resist using acetone.

23. A method of captivating a substrate within a holder for photolithographic processing comprising the steps of:

placing a substrate having two opposed major surfaces within a holder, said holder having two opposed major surfaces and at least one aperture appropriately dimensioned for accepting said substrate;

laminating a dry film photopolymer resist to at least one surface of said holder and said substrate, thereby captivating said substrate within the aperture of said holder;

polymerizing said resist in a manner which allows removal of resist in certain areas while leaving at least one uninterrupted area extending from one surface of said holder to a corresponding surface of said substrate; and removing resist in certain areas, thereby leaving a retaining tab of resist in at least one uninterrupted area extending from one surface of said holder to one surface of said substrate.

24. A substrate processed in accordance with claim 23.

* * * * *